United States Patent
Kamikawa et al.

(10) Patent No.: US 7,691,653 B2
(45) Date of Patent: Apr. 6, 2010

(54) NITRIDE SEMICONDUCTOR LASER ELEMENT AND METHOD FOR MANUFACTURING THE SAME

(75) Inventors: Takeshi Kamikawa, Mihara (JP); Yoshinobu Kawaguchi, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 755 days.

(21) Appl. No.: 11/500,334

(22) Filed: Aug. 8, 2006

(65) Prior Publication Data
US 2007/0054431 A1    Mar. 8, 2007

(30) Foreign Application Priority Data
Aug. 26, 2005    (JP)    ............................. 2005-245178
Nov. 29, 2005    (JP)    ............................. 2005-343116

(51) Int. Cl.
*H01L 21/00*    (2006.01)
(52) U.S. Cl. .................... 438/29; 438/31; 257/E21.697
(58) Field of Classification Search .................. 438/29, 438/31; 257/E21.697
See application file for complete search history.

(56) References Cited
U.S. PATENT DOCUMENTS
6,067,310 A * 5/2000 Hashimoto et al. ....... 372/49.01

2003/0029836 A1* 2/2003 Lindstrom et al. ............ 216/67
2005/0059181 A1* 3/2005 Yamane et al. ................ 438/22

FOREIGN PATENT DOCUMENTS

| CN | 1604412 | 4/2005 |
|---|---|---|
| JP | 2002-043691 | 2/2002 |
| JP | 2002-335053 | 11/2002 |
| JP | A-2002-335053 | 11/2002 |
| JP | 2005-079406 | 3/2005 |

* cited by examiner

*Primary Examiner*—Lex Malsawma
(74) *Attorney, Agent, or Firm*—Harness, Dickey & Pierce, P.L.C.

(57) ABSTRACT

A substrate with a nitride semiconductor layer is cleaved to form resonator end faces, on which a coating film is formed so as to make a nitride semiconductor laser bar. This is divided into nitride semiconductor laser elements. Prior to forming the coating film on the resonator end face, the resonator end face is exposed to a plasma atmosphere generated from the gas containing nitrogen gas. When a ratio of nitrogen to gallium in the surface of the resonator end face before the exposure is represented by "a", an average value of ratios of nitrogen to gallium inside from the surface of the resonator end face before the exposure is represented by "b", a ratio of nitrogen to gallium in the surface of the resonator end face after the exposure to the first plasma atmosphere is represented by "d", and an average value of ratios of nitrogen to gallium inside from the surface of the resonator end face after the exposure is represented by "e", the value "g" that is expressed by $g=(b \cdot d)/(a \cdot e)$ is set to a value that satisfies $g \geq 0.8$.

28 Claims, 10 Drawing Sheets

NITRIDE SEMICONDUCTOR LASER ELEMENT AND METHOD FOR MANUFACTURING THE SAME

This application claims priority under 35 USC 119(a) based on Japanese Patent Application No. 2005-245178 filed on Aug. 26, 2005 and No. 2005-343116 filed on Nov. 29, 2005, the entire contents of which are hereby incorporated by reference.

BACKGROUND OF THE INVENTION

1. Field of the Invention

The present invention relates to a semiconductor laser element having a nitride semiconductor layer and a method for manufacturing the same.

2. Description of Related Art

In these years, an optical disc is requested to have larger and larger memory capacity with higher density. In order to responds to this request, BD (Blue ray Disc) and HD-DVD (High Definition DVD) using a blue color semiconductor laser are standardized, and devices such as decoders conforming the standards have been commercialized. New types of disks for these standards require a high power blue color semiconductor laser with high reliability so as to enable higher density and high speed writing of information on a two-layer disk.

An AlGaAs system or an InGaAlP system semiconductor laser for reproducing or writing information on a conventional CD or DVD includes has a coating film made of a dielectric such as $SiO_2$, $Al_2O_3$ or $Si_3N_4$ on an end face of resonator for preventing a deterioration or an optical damage to the end face of resonator that is an exit face of a laser beam. However, if an EB (Electron Beam) evaporator or a sputtering device is used for depositing a coating film as it is on the nitride semiconductor laser that is a blue color semiconductor laser, a COD level that is a critical power at which a COD (Catastrophe Optical Damage) may occur is low, so that reliability is very low. Therefore, an improvement in coating technique is necessary. Note that the COD means a phenomenon of melting crystals constituting a semiconductor laser element due to absorption of laser beam by the exit face.

JP-A-2002-335053 discloses a method for manufacturing a semiconductor laser, in which a resonator end face of the semiconductor laser element formed by cleavage is exposed to an argon plasma atmosphere so that a natural oxide film formed on the resonator end face naturally is removed by argon particles in a plasma state. Thus, the adhesion of the coating film formed on the resonator end face to the resonator end face is enhanced so that reliability of the resonator end face is improved. In addition, it is also proposed to remove moisture or the like that adheres to the surface of the semiconductor by heating the same after the cleavage, so as to improve the reliability more.

In the exposure to the argon plasma atmosphere that is used for the method for manufacturing a semiconductor laser as proposed in JP-A-2002-335053, a voltage is not applied to the semiconductor laser bar and a holder thereof, and an argon ion is not attracted to the semiconductor laser bar by a potential difference so as to collide the resonator end face of the semiconductor laser bar. In other words, it is not so-called counter sputtering. In this case, the ion that reaches the resonator end face of the semiconductor laser bar is regarded to have energy of tens of keV. This energy of the ion is sufficient for removing by plasma thereof a moisture, carbon, a natural oxide film or the like adhered to the surface of the semiconductor laser bar, and it has been considered to damage hardly to the resonator end face of the semiconductor laser bar.

The inventor performed an ultimate analysis of the resonator end face that had been exposed to the argon plasma atmosphere for studying effects of the exposure to the argon plasma atmosphere. As a result, the inventor found that carbon and oxygen were not observed when the exposure to the argon plasma atmosphere had been performed though they are observed if the exposure to the argon plasma atmosphere was not performed. The observed carbon and oxygen are considered to be contained in the natural oxide film, moisture or contaminant that adhered during the time period after forming the resonator end face by cleavage until forming the coating film. When a heat treatment had been performed on the resonator end face instead of the exposure to the argon plasma atmosphere, a similar result was obtained.

From this result, it can be said that the formation of the coating film should be performed after removing the carbon and the oxygen from the resonator end face for improving the semiconductor laser element, and that such formation of the coating film can be realized by a heat treatment or exposure to the argon plasma atmosphere.

However, according to an experiment performed by the inventor, the following fact was found. That is, although the exposure to the argon plasma atmosphere is effective for removing the carbon and the oxygen from the resonator end face, the surface of the semiconductor laser element including the resonator end face is affected by the exposure if the semiconductor laser element is a nitride semiconductor laser element.

The detail of this experiment is as follows. Two samples of the nitride semiconductor laser element were manufactured. One of the samples was exposed to the argon plasma atmosphere, while the other sample was not exposed to the argon plasma atmosphere. Each of the samples was subjected to an aging test, and the COD level of each sample was measured before and after the aging test. FIG. 11 shows a variation of the COD levels before the aging and after 200 hours of the aging about two samples. One of the samples has the coating film of $Al_2O_3$ formed on the resonator end face after exposure to the argon plasma atmosphere. The other sample has the coating film of $Al_2O_3$ formed on the resonator end face that is in the state after the cleavage without exposed to the argon plasma atmosphere. The conditions of the aging include an ambient temperature at 70° C., a power at 60 mW, APC (Automatic Power Control) driving and CW (Continuous Wave) driving. In addition, the COD levels were measured under the condition of 50 ns, duty factor of 50%, at room temperature and a pulse measurement.

As understood from FIG. 11, the COD level before the aging, i.e., an initial COD level is lower for the sample exposed to the argon plasma atmosphere than the other sample. This is considered to be because that the exposure to the argon plasma atmosphere had some influence to the resonator end face.

In addition, the COD levels after the aging of both the samples with the exposure and without the exposure to the argon plasma atmosphere are dropped from the COD levels before the aging. However, the sample that was exposed to the argon plasma atmosphere has a higher COD level than the sample that was not exposed to the argon plasma atmosphere. In other words, the relationship between the two COD levels is inverted after the exposure. Therefore, it can be said that deterioration in the COD level due to aging is reduced by the exposure to the argon plasma atmosphere so that reliability can be improved.

The reason of this can be considered as follows. In the nitride semiconductor laser element that was not exposed to the argon plasma atmosphere, there is an interface state that can cause a non-light emission recombination at the interface between the resonator end face and the coating film due to an impurity such as the natural oxide film or the like in the resonator end face. Therefore, the resonator end face was deteriorated by the heat during the aging. On the contrary, in the nitride semiconductor laser element that was exposed to the argon plasma atmosphere, the interface state that can cause a non-light emission recombination at the interface between the resonator end face and the coating film is reduced compared with the case without the argon plasma atmosphere. Therefore, there is little heat generated during the aging so that the deterioration in the resonator end face is reduced, resulting in little deterioration in the COD level.

In other words, although the exposure to the argon plasma atmosphere has an advantage that deterioration in the COD level can be reduced, it also has a disadvantage that the initial COD level is decreased. The decrease of the initial COD level may be a serious problem when a high power of the nitride semiconductor laser element is required. For example, in the case of the semiconductor laser element having characteristics shown in FIG. 11, it is difficult to realize a high power above the initial COD level at 200 mW for the one that was exposed to the argon plasma atmosphere.

Although the exposure to the argon plasma atmosphere may cause some damage to the resonator end face as described above, detail or a specific content of the damage has not been studied up to now. Therefore, the inventor studied about it and found that the exposure to the argon plasma atmosphere causes reduction of quantity of nitrogen in the resonator end face made up of a nitride semiconductor. The detail of this will be described below.

Concerning the nitride semiconductor laser element, a ratio of the number of atoms between gallium and nitrogen was measured by an AES (Auger Electron Spectroscopy) method while sputter etching was performed on the resonator end face from the surface toward the inside. The measurement was performed in the area where GaN is exposed on the surface. FIG. 12 shows the measurement result of the sample without the exposure to the argon plasma atmosphere and the sample with the exposure to the argon plasma atmosphere. The vertical axis corresponds to the ratio of the number of nitrogen atoms to that of gallium atoms, while the horizontal axis corresponds to a time period of the sputter etching. Hereinafter, in this specification, every description about a ratio of nitrogen to gallium means the ratio of the number of atoms. Here, one minutes of the sputter etching corresponds to a depth of approximately 3 nm. As understood from FIG. 12, the exposure to the argon plasma atmosphere caused a reduction of the ratio of nitrogen to gallium at the top surface of the nitride semiconductor laser element (at zero in the horizontal axis in FIG. 12).

Further, concerning another nitride semiconductor laser element, the ratio of the number of atoms between gallium and nitrogen was measured by the AES method while sputter etching was performed on the resonator end face from the surface toward the inside. FIG. 13 shows the measurement result of the sample without the exposure to the argon plasma atmosphere and the sample with the exposure to the argon plasma atmosphere. The horizontal axis corresponds to a depth from the surface of the resonator end face, while the vertical axis corresponds to the ratio of nitrogen to gallium. It is understood from FIG. 13 too that the exposure to the argon plasma atmosphere caused a reduction of the ratio of nitrogen to gallium at the top surface of the nitride semiconductor laser element.

As described above, the ratio of nitrogen to gallium is reduced on the surface of the nitride semiconductor laser element that was exposed to the argon plasma atmosphere, and the reason of this is considered to be removal of nitrogen having a high vapor pressure due to an attack of the excited argon ions. In addition, this reason may include that the exposure to the argon plasma atmosphere causes removal and reduction of the nitrogen from the surface of the resonator end face so that the resonator end face becomes the state where gallium exists more than nitrogen. Since stoichiometry in which a ratio of nitrogen to gallium is balanced as 1:1 is imbalanced substantially, a non-light emission center increases resulting in an increase of heat value that causes a rapid deterioration in the end face. For this reason, the state of removing nitrogen depends on a time period of the exposure to the argon plasma atmosphere, a power of a micro wave, a treatment temperature, and the like.

As shown in FIG. 11, the sample that was exposed to the argon plasma atmosphere has the lower initial COD level than the sample that was not exposed to the argon plasma atmosphere. This is considered to be resulted from that the removal of the nitrogen from the resonator end face brings about an increase of the non-light emission center as well as a probability of the non-light emission recombination so that the heat value increases.

Furthermore, in the method for manufacturing a semiconductor laser as proposed in JP-A-2002-335053, the semiconductor laser bar is heated for evaporating and removing the moisture adhered to the end surface before forming the coating film. This process with heating the semiconductor laser bar to a temperature higher than the room temperature is usually performed for evaporating moisture or improving quality of the coating film. However, in the case of the nitride semiconductor laser, it was found that this heating process causes removal of nitrogen from the resonator end face resulting in lowering of the COD level.

SUMMARY OF THE INVENTION

An object of the present invention is to provide a method for manufacturing a nitride semiconductor laser element in which impurity such as a natural oxide film formed on a resonator end face can be removed for improving reliability, and an accompanying damage to the resonator end face, i.e., removal of nitrogen from the same can be reduced for improving an initial COD level.

A method for manufacturing a nitride semiconductor laser element according to the present invention comprises a nitride semiconductor layer formation step for forming a nitride semiconductor layer on a substrate, and a cleavage step for cleaving the substrate on which the nitride semiconductor layer is formed, so as to form two resonator end faces that are parallel to each other. The method further comprises a first exposure step for exposing the resonator end face to a first plasma atmosphere generated from nitrogen gas or a mixture gas of an inert gas and nitrogen gas. In the first exposure step, when a ratio of nitrogen to gallium in the surface of the resonator end face before the exposure to the first plasma atmosphere is represented by "a", an average value of ratios of nitrogen to gallium inside from the surface of the resonator end face before the exposure is represented by "b", a ratio of nitrogen to gallium in the surface of the resonator end face after the exposure to the first plasma atmosphere is represented by "d", and an average value of ratios of nitrogen to gallium inside from the surface of the resonator end face after the exposure is represented by "e", the value "g" that is expressed by g=(b·d)/(a·e) is set to a value that satisfies g≧0.8.

In addition, the method for manufacturing a nitride semiconductor laser element according to the present invention further comprises a second exposure step for exposing the resonator end face to a second plasma atmosphere generated from an inert gas, between the cleavage step and the first exposure step.

In addition, the method for manufacturing a nitride semiconductor laser element according to the present invention further comprises forming an end face coating film for protecting the resonator end face from an optical damage, after the first exposure step.

Further in the method for manufacturing a nitride semiconductor laser element according to the present invention, the end face coating film is made of an oxide of Al, Ti, Si, Y, Nb, Ta or Zr.

Further in the method for manufacturing a nitride semiconductor laser element according to the present invention, the end face coating film is made of a nitride of Al or Si.

Further in the method for manufacturing a nitride semiconductor laser element according to the present invention, both the two resonator end faces have the end face coating films, which are made of the same material.

Further in the method for manufacturing a nitride semiconductor laser element according to the present invention, the end face coating film is formed by an electron cyclotron resonance sputtering method or a high frequency sputtering method.

Further in the method for manufacturing a nitride semiconductor laser element according to the present invention, a temperature of the substrate in the first exposure step is within the range of 150-500° C.

Further in the method for manufacturing a nitride semiconductor laser element according to the present invention, a temperature of the substrate in the first exposure step is within the range of 200-400° C.

Further in the method for manufacturing a nitride semiconductor laser element according to the present invention, a temperature of the substrate in the second exposure step is within the range of 150-500° C.

Further in the method for manufacturing a nitride semiconductor laser element according to the present invention, a temperature of the substrate in the second exposure step is within the range of 200-400° C.

In addition, a nitride semiconductor laser element according to the present invention is manufactured by the method described above.

In addition, a method for manufacturing a nitride semiconductor laser element according to the present invention comprise a nitride semiconductor layer formation step for forming a nitride semiconductor layer on a substrate, a cleavage step for cleaving the substrate on which the nitride semiconductor layer is formed, so as to form two resonator end faces that are parallel to each other, and a coating film formation step for forming coating films on the resonator end faces. The method further comprises a first exposure step for exposing the resonator end face to a first plasma atmosphere generated from a gas containing nitrogen gas, between the cleavage step and the coating film formation step.

Further in the method for manufacturing a nitride semiconductor laser element according to the present invention, the resonator end face is not exposed to air during the period from the first exposure step until the coating film formation step is completed.

Further in the method for manufacturing a nitride semiconductor laser element according to the present invention, the first plasma atmosphere is generated from a gas containing only nitrogen.

Further in the method for manufacturing a nitride semiconductor laser element according to the present invention, the first plasma atmosphere is generated from a gas containing nitrogen and argon.

Further in the method for manufacturing a nitride semiconductor laser element according to the present invention, a film containing the element that constitutes the coating film is not formed on the resonator end face in the first exposure step.

Further in the method for manufacturing a nitride semiconductor laser element according to the present invention, the substrate on which the nitride semiconductor layer is formed is heated to a temperature within the range of 100-500° C. in the first exposure step.

Further in the method for manufacturing a nitride semiconductor laser element according to the present invention, a time period for exposing the resonator end face to the first plasma atmosphere in the first exposure step is within the range of 30 seconds to 20 minutes.

Further in the method for manufacturing a nitride semiconductor laser element according to the present invention, the first plasma atmosphere is generated by an electron cyclotron resonance.

Further in the method for manufacturing a nitride semiconductor laser element according to the present invention, a power of microwave of the electron cyclotron resonance in the first exposure step is within the range of 200-800 watts.

Further in the method for manufacturing a nitride semiconductor laser element according to the present invention, at least one of the coating films is made of an oxide of Al, Ti, Si, Y, Nb, Ta, Zr, Hf or Zn, or a nitride of Al or Si, or an oxide nitride of Al or Si.

In addition, the method for manufacturing a nitride semiconductor laser element according to the present invention further comprises a second exposure step for exposing the resonator end face to a second plasma atmosphere generated from an inert gas or a mixture gas of an inert gas and nitrogen gas, between the cleavage step and the first exposure step.

Further in the method for manufacturing a nitride semiconductor laser element according to the present invention, the inert gas is argon in the second exposure step.

Further in the method for manufacturing a nitride semiconductor laser element according to the present invention, the substrate on which the nitride semiconductor layer is formed is heated to a temperature within the range of 100-500° C. in the second exposure step.

Further in the method for manufacturing a nitride semiconductor laser element according to the present invention, a time period for exposing the resonator end face to the second plasma atmosphere in the second exposure step is within the range of 30 seconds to 20 minutes.

Further in the method for manufacturing a nitride semiconductor laser element according to the present invention, the second plasma atmosphere is generated by an electron cyclotron resonance.

Further in the method for manufacturing a nitride semiconductor laser element according to the present invention, a power of microwave of the electron cyclotron resonance in the second exposure step is within the range of 200-800 watts.

DESCRIPTION OF THE PREFERRED EMBODIMENTS

First Embodiment

Figure 1:
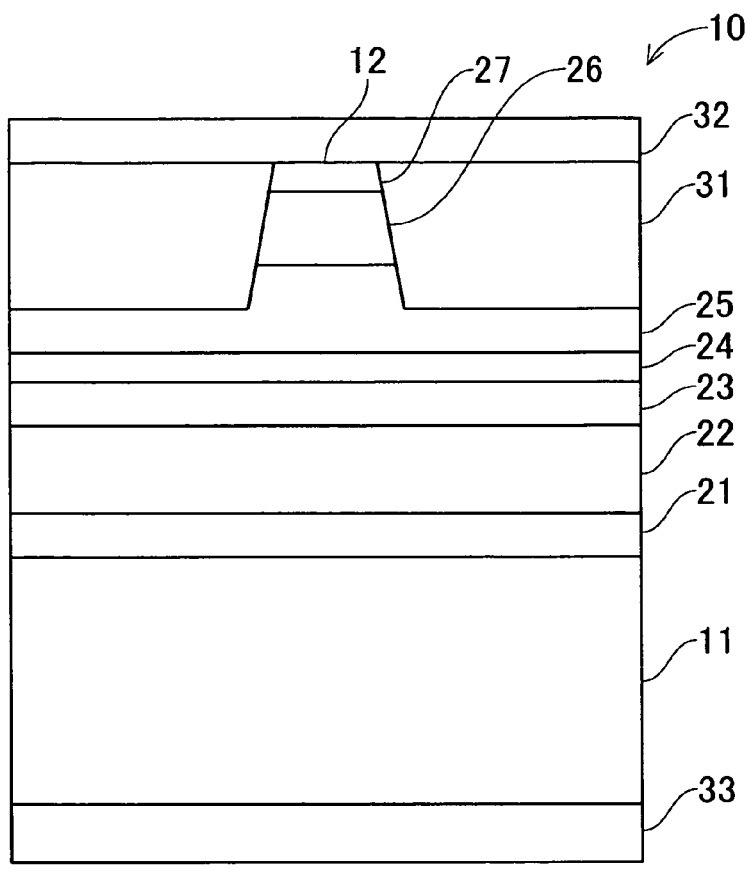
FIG. 1 is a cross section of a nitride semiconductor laser bar according to a first embodiment of the present invention, viewed from a direction parallel to a cavity length.
Figure 2:
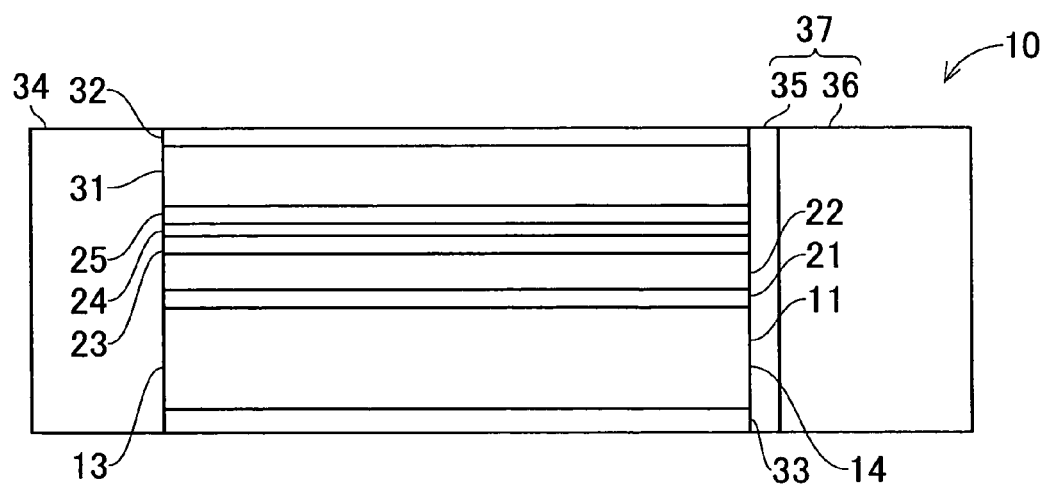
FIG. 2 is a side view of the nitride semiconductor laser bar according to the first embodiment, viewed from a direction perpendicular to the cavity length.
Figure 3:
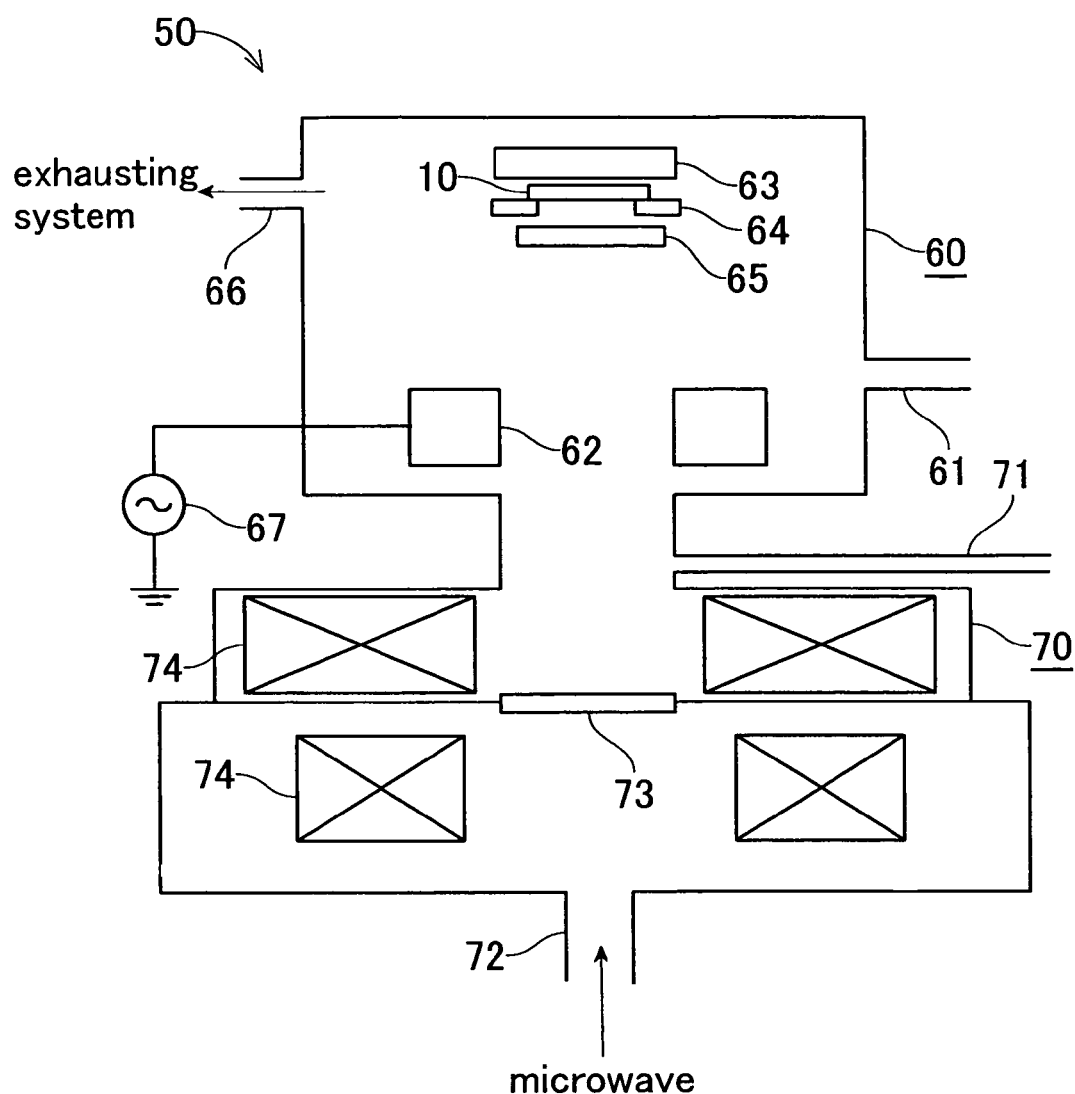
FIG. 3 shows a general structure of an ECR sputtering device.
Figure 4:
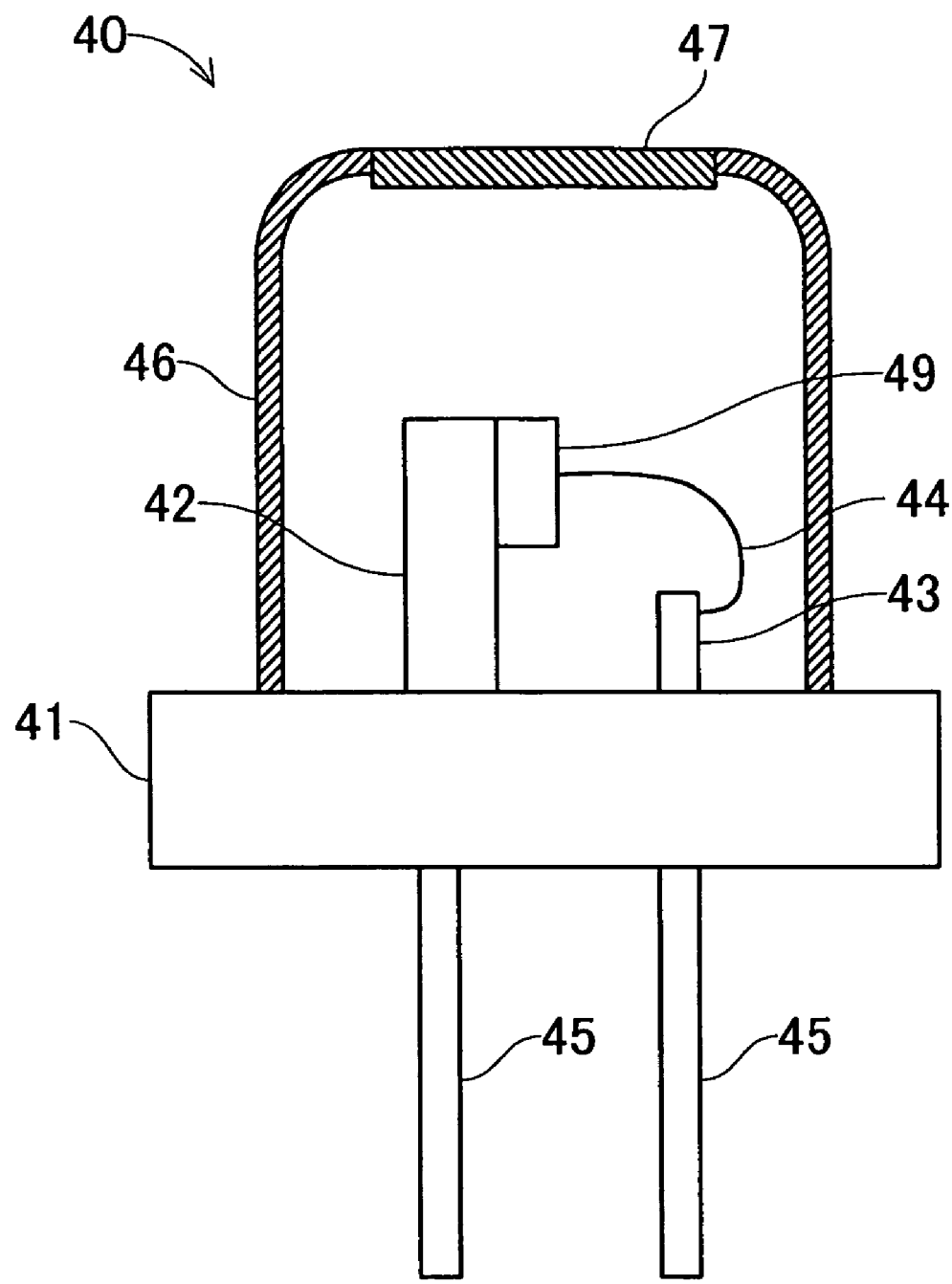
FIG. 4 shows a general structure of a nitride semiconductor laser device according to the first embodiment.

A first embodiment of the present invention will be described below with reference to the attached drawings. FIG. 1 is a front view of a nitride semiconductor laser bar according to the first embodiment viewed from a direction parallel to a cavity length, FIG. 2 is a side view of the nitride semiconductor laser bar viewed from a direction perpendicular to the cavity length, FIG. 3 shows a general structure of an ECR sputtering device, and FIG. 4 shows a general structure of a nitride semiconductor laser device.

A nitride semiconductor laser bar 10, as shown in FIG. 1, includes an n-type GaN substrate 11 on which an n-AlGaInN buffer layer 21, an n-AlGaInN clad layer 22, an n-AlGaInN guide layer 23, an AlGaInN multiquantum well active layer 24, a p-AlGaInN guide layer 25, a p-AlGaInN clad layer 26, and a p-AlGaInN contact layer 27 are formed in this order from the substrate 11 side. A ratio of mixed crystals in each layer is adjusted appropriately though it has no essential connection with the present invention. Note that the active layer 24 may contain approximately 0.01-10% of V group element such as As or P.

A stripe ridge 12 extending in the resonator direction is formed at least in a part of the p-AlGaInN guide layer 25, the p-AlGaInN clad layer 26 and the p-AlGaInN contact layer 27. A width of the stripe is in the range of approximately 1.2-2.4 μm, and its typical value is approximately 1.5 μm.

A p-electrode 32 is formed so as to contact with the p-AlGaInN contact layer 27, and an insulator film 31 is formed under the p-electrode 32 except for a part of the ridge 12. In this way, the nitride semiconductor laser bar 10 has a so-called ridge stripe structure. In addition, an n-electrode 33 is formed on the rear side of the nitride semiconductor laser bar 10.

The nitride semiconductor laser bar 10 is produced by cleaving a nitride semiconductor wafer including the above-mentioned layers formed on a substrate and electrodes with a diamond point cutting and breaking method. The surfaces obtained by this cleavage are resonator end faces 13 and 14 that are parallel with each other as shown in FIG. 2.

In addition, a low reflection coating film 34 having a reflectance of approximately 5% is formed on the resonator end face 13 on the light exit side, while a high reflection coating film 37 having a reflectance of approximately 95% is formed on the resonator end face 14 on the light reflection side as shown in FIG. 2. The low reflection coating film 34 and the high reflection coating film 37 protect the resonator end faces 13 and 14 from oxidization, control a reflectance, and protect the resonator end faces 13 and 14 from an optical damage.

Next, formation of the low reflection coating film 34 and the high reflection coating film 37, and a preprocess thereof will be described below.

First, a device that is used for forming the low reflection coating film 34 and the high reflection coating film 37 will be described. The formation of these coating films is performed by using a device with a vacuum mechanism that is capable of continuous exposure to a plasma atmosphere and forming the coating films without exposing to air, e.g., an ECR (Electron Cyclotron Resonance) sputtering device 50 as shown in FIG. 3.

With reference to FIG. 3, a structure of the ECR sputtering device 50 will be described. The ECR sputtering device 50 has two main parts that are a film forming furnace 60 and a plasma production chamber 70. The film forming furnace 60 is equipped with a gas inlet 61, a target 62, a heater 63, a sample stage 64, a shutter 65 and an exhaust opening 66. The sample stage 64 supports the nitride semiconductor laser bar 10 attached to a holder (not shown) in the orientation such that the coating film can be formed on the resonator end face 13 or the resonator end face 14. The exhaust opening 66 is equipped with a vacuum pump (not shown), so that gas inside the film forming furnace 60 can be exhausted through the exhaust opening 66. The target 62 is connected electrically to a RF (Radio Frequency) power supply 67. In addition, the plasma production chamber 70 is equipped with a gas inlet 71, a microwave inlet 72, a microwave introducing window 73 and a magnetic coil 74. When the microwave is introduced from the microwave inlet 72 via the microwave introducing window 73, plasma is generated in the gas introduced from the gas inlet 71.

Prior to forming the low reflection coating film 34 and the high reflection coating film 37, the inside of the film forming furnace 60 is oxidized. The reason why this oxidization inside the furnace is performed will be described below.

Formation of coating films by using the ECR sputtering device 50 is usually achieved by sputtering the target 62 made of a metal target material such as aluminum or silicon and let the material react with oxygen and nitrogen in a plasma state on the surface of the nitride semiconductor laser bar 10 placed on the sample stage 64 so as to form the films of an oxide and a nitride of the target material. In addition, prior to the formation of the coating films, exposure of the resonator end face to the plasma atmosphere is also performed for removing a natural oxide film or the like.

In this case, the target material in a metal state without oxidation nor nitriding adheres to the inner wall of the film forming furnace 60 except for a vicinity of the surface of the nitride semiconductor laser bar 10. In addition, the surface of the target 62 is also exposed with a metal state of the target material. While the inside of the film forming furnace 60 is in such a state, the resonator end face is exposed to the plasma atmosphere. Then, the target material in a metal state adhered to the inner wall of the film forming furnace 60 and the target 62 is sputtered and adhere to the surface of the nitride semiconductor laser bar 10 including the resonator end face.

When the low reflection coating film 34 and the high reflection coating film 37 is formed, an RF voltage is applied to the target 62 from the RF power supply 67 for sputtering the target 62. However, when the resonator end face is exposed to the plasma atmosphere, the RF voltage is not applied. Nevertheless the target 62 is sputtered because the generation of plasma always generates a low potential of approximately a few volts in the target 62 without the application of the RF voltage. Although the self-generated potential in the target 62 is approximately a few volts, the target 62 is sputtered in a small quantity compared with the case where the RF voltage is applied. Moreover, in some cases, the target material in a metal state adhered to the inner wall of the film forming furnace 60 is also sputtered.

If the plasma atmosphere to which the resonator end face is exposed is generated only from argon gas, the target material of the target 62 such as aluminum or silicon is sputtered, so that a film of the target material in a metal state is formed on the resonator end faces 13 and 14. The aluminum or the silicon in a metal state is heated when it absorbs light in an oscillation wavelength range from the nitride semiconductor laser element that is obtained by dividing the nitride semiconductor laser bar 10, and it causes a COD breakdown. Therefore, if it exists in the resonator end faces 13 and 14, a conspicuous drop of a COD level may be caused.

In addition, if plasma generated from a mixture gas of argon gas and nitrogen gas, a film made of not a metal but a nitride of the target material having little light absorption is formed. The nitride film has a strong stress, so it causes a bad influence to characteristics of the nitride semiconductor laser element if it is formed on the resonator end faces 13 and 14. In particular, since the film that is formed naturally without application of the RF voltage does not have good quality, it is not suitable as a coating film.

This sputtering of the target 62 when the resonator end face is exposed to the plasma atmosphere can be prevented by oxidizing the inner wall of the film forming furnace 60 and the surface of the target 62 in advance. If the surface of the target 62 is oxidized, the self-generated potential becomes low, so a quantity of sputtered material becomes small. In addition, if the target material is aluminum, the $Al_2O_3$ that is an aluminum oxide has a very low sputtering rate, i.e., it is hardly sputtered compared with aluminum in a metal state. Even if it is sputtered, it cannot cause a drop of the COD level since what adheres to the nitride semiconductor laser bar 10 is not a metal but an oxide that does not cause the light absorption.

As the method of oxidizing the inner wall of the furnace, there are two methods as follows. In one of the methods, the plasma generated from only oxygen gas is generated inside the film forming furnace 60. Thus, the inner wall of the film forming furnace 60 and the surface of the target 62 are oxidized.

In the other method, a mixture gas of argon gas and oxygen gas containing the oxygen gas at a ratio such that the target 62 is sputtered in an oxide state is supplied from the gas inlet 61 to the inside of the film forming furnace 60, and then the RF voltage is applied to the target 62. Thus, the target material is sputtered in the oxide state from the target 62, and not only the surface of the nitride semiconductor laser bar 10 but also the entire inner wall of the film forming furnace 60 is covered not by a metal but an oxide of the target material. This ratio of the oxygen gas can be known by increasing a flow rate of the oxygen gas gradually while applying the RF voltage having a constant power to the target 62 and monitoring a potential on the surface of the target 62. When the flow rate of the oxygen gas as well as the ratio of the oxygen gas is increased, a potential monitored is lowered rapidly at a certain flow rate. This means that the oxidization of the target 62 becomes faster than the sputtering of the target 62 by argon and that the surface of the target material is sufficiently oxidized. Therefore, if the oxygen gas is supplied faster than this flow rate while the RF voltage is applied, the target material is sputtered from the target 62 in a state of oxide so that the target 62 and the inside wall of the film forming furnace 60 is covered with the oxide of the target material.

Note that this process must be performed before the nitride semiconductor laser bar 10 is put in the film forming furnace 60 or in the state where the shutter 65 is closed after the nitride semiconductor laser bar 10 is put in the film forming furnace 60.

Next, in order to remove the natural oxide film, the moisture, or the contaminant from the resonator end faces 13 and 14 of the nitride semiconductor laser bar 10 placed on the sample stage 64 inside the film forming furnace 60, the surface of the nitride semiconductor laser bar 10 including the resonator end face 13 and 14 is exposed to the plasma atmosphere. This condition is shown in Table 1 below. Although the plasma atmosphere is generated from only nitrogen gas or a mixture gas containing nitrogen gas for reducing removal of nitrogen in this embodiment, the case where the plasma atmosphere is generated from only argon gas is also shown as a comparison example 1.

TABLE 1

|  | example 1 | example 2 | comparison example 1 |
|---|---|---|---|
| plasma atmosphere | only nitrogen gas | mixture of nitrogen gas and argon gas | only argon gas |
| argon flow rate [sccm] | 0 | 20 | 40 |
| nitrogen flow rate [sccm] | 20 | 5.5 | 0 |
| microwave power [W] | 500 | 500 | 500 |
| furnace back pressure [Pa] | $4.8 \times 10^{-2}$ | $8.3 \times 10^{-2}$ | $1.4 \times 10^{-1}$ |
| process time [min] | 5 | 5 | 5 |
| process temperature | room temperature | room temperature | room temperature |

Under the condition shown in Table 1, the gas is supplied into the ECR sputtering device 50 via the gas inlet 61 and the gas inlet 71, and the microwave is applied so that the plasma is generated. Then, the resonator end face 13 and the resonator end face 14 of the nitride semiconductor laser bar 10 placed inside the film forming furnace 60 is exposed to the plasma atmosphere when the shutter 65 just below the same is opened, so that the natural oxide film or the like is removed. In this case, the power of the RF power supply 67 connected to the target 62 is set to 0 watt.

Next, the low reflection coating film 34 and the high reflection coating film 37 are formed on the resonator end faces 13 and 14, respectively. In this embodiment, a film made of $Al_2O_3$ is formed as the low reflection coating film 34 on the resonator end face 13 of the light exit side. First, argon gas is supplied into the ECR sputtering device 50 at the flow rate of 40 sccm, and oxygen gas is supplied into the same at the flow rate of 6-7 sccm. Then, the microwave is applied so that a plasma is generated, and the RF voltage is applied to the target 62 made of aluminum. Then, argon in a plasma state is attracted by the target 62 and hits the target 62 so that aluminum is scattered and is bonded with oxygen in a plasma state. If the shutter 65 is opened in this state, the low reflection coating film 34 made of $Al_2O_3$ is formed on the resonator end face 13 of the nitride semiconductor laser bar 10. In this case, an internal pressure of the film forming furnace 60 is set to approximately $1 \times 10^{-1}$ Pa, the microwave power is set to 500 watts, and the RF power supply 67 is set to 500 watts.

The time period while the shutter 65 is opened is set to a value such that the low reflection coating film 34 becomes a thickness corresponding to a desired reflectance. This time period can be calculated as follows. First, a film of the same material as the low reflection coating film 34 is formed on a dummy in advance, and a thickness of the film is calculated from a reflectance of the film. Then, the time period is calculated in accordance with the thickness of the film and a film forming rate that is derived from a time period while the shutter 65 is opened. A thickness of the coating film on the light exit side is usually adjusted so that the coating film has a low reflectance. In this embodiment, a thickness of $Al_2O_3$ is set to 80 nm so that the reflectance becomes 5%. If there is provided a system for monitoring a thickness of the film during formation of the low reflection coating film 34, opening and closing of the shutter 65 may be controlled in accordance with a signal from the monitoring system.

Next, the high reflection coating film 37 is formed on the resonator end face 14 of the light reflection side. In this embodiment, high reflection coating film 37 consists of a protection layer 35 and a reflection layer 36 formed in this order from the resonator end face 14 side. The reflection layer 36 is usually made of a plurality of layers formed alternately with materials having different refractive indexes for obtaining a high reflectance at approximately 95%. Here, the protection layer 35 is made of $Al_2O_3$, while the reflection layer 36 is made of nine layers including $SiO_2$, $TiO_2$, $SiO_2$, $TiO_2$, $SiO_2$, $TiO_2$, $SiO_2$, $TiO_2$ and $SiO_2$ formed in this order from the resonator end face 14 side.

After the low reflection coating film 34 is formed, the nitride semiconductor laser bar 10 is inverted inside the film forming furnace 60 without taken outside. Then, the resonator end face 14 is directed to the shutter 65 side and is exposed to the plasma atmosphere generated from gas including nitrogen gas in the same procedure as the case where the low reflection coating film 34 is formed on the resonator end face 13 of the light exit side. Thus, the protection layer 35 and the layers of the reflection layer 36 are formed. A thickness of each layer of the high reflection coating film 37 is set to a value such that the entire reflectance becomes a desired reflectance. Here, a thickness of the protection layer 35 is set to 6 nm that has little influence to a reflectance of the reflection layer 36, and thicknesses of the layers the reflection layer 36 are set to 70 nm, 45 nm, 70 nm, 45 nm, 70 nm, 45 nm, 70 nm, 45 nm and 140 nm in this order from the resonator end face 14 side. Note that there is no problem if the nitride semiconductor laser bar 10 is once taken out of the film forming furnace 60 when it is inversed.

The nitride semiconductor laser bar 10 on which the low reflection coating film 34 and the high reflection coating film 37 were formed successfully as described above is divided into nitride semiconductor laser elements. As shown in FIG. 4, a nitride semiconductor laser element 49 is mounted on a submount 42 made of AlN, SiC or the like, and each submount 42 is mounted on a stem 41. Finally, the nitride semiconductor laser element 49 is connected via a wire 44 to a pin 43 that is provided on the face of the stem 41 on which the submount 42 was mounted is connected, and it is sealed with a cap 46 in an airtight manner so that the nitride semiconductor laser device 40 is completed. Two lead pins 45 are provided on the face of the stem 41 opposite to the face on which the submount 42 was mounted. In addition, the cap 46 is provided with a glass window 47 through which a laser beam emitted by the nitride semiconductor laser element 49 can go out.

Figure 5:
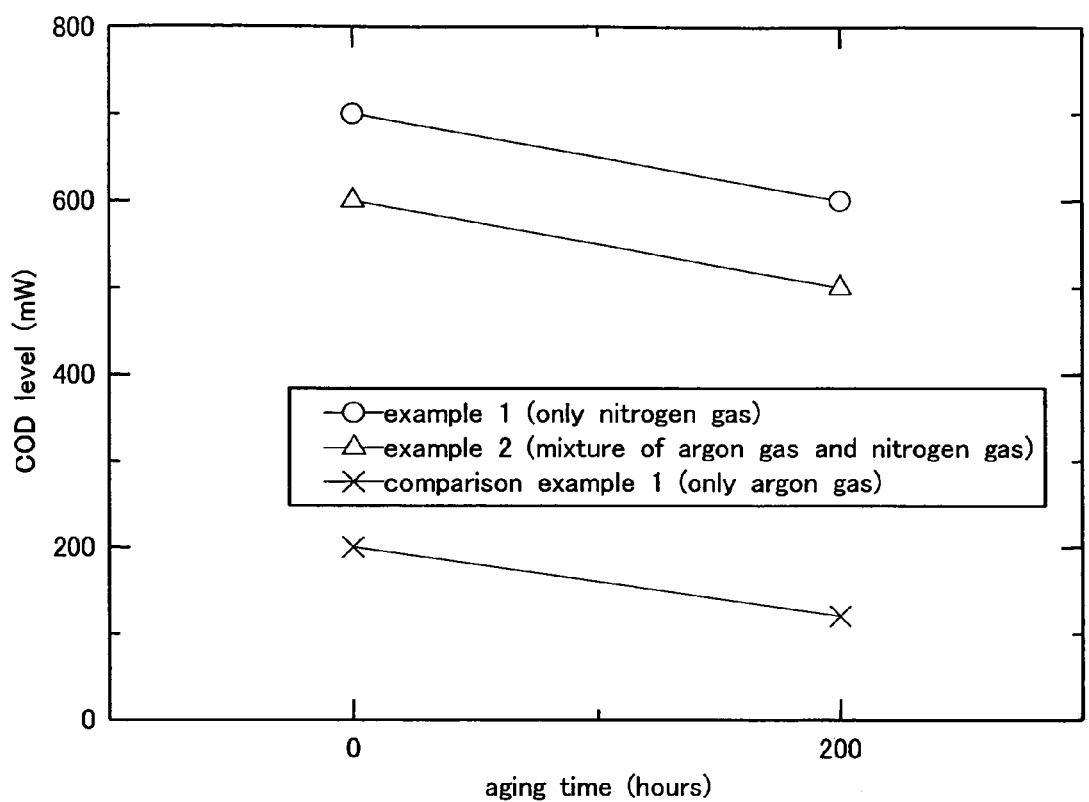
FIG. 5 is a graph showing COD levels of a nitride semiconductor laser element according to the first embodiment, before and after an aging.

The three samples of the nitride semiconductor laser device 40 were manufactured as described above. A first sample was manufactured using the only nitrogen gas of the example 1 for generating the plasma atmosphere to which the resonator end face was exposed is in Table 1. A second sample was manufactured using the mixture gas of argon gas and nitrogen gas of the example 2, and a third sample was manufactured using the only argon gas of the comparison example 1. Then, the COD levels were measured for the three samples in the initial state and after aging of 200 hours. The result is shown in FIG. 5 and Table 2. FIG. 5 shows the COD levels of these samples plotted in the plane in which the horizontal axis corresponds to the aging time and the vertical axis corresponds to the COD level. The aging was performed under the condition of the ambient temperature at 70° C. and an APC drive at a power of 60 mW. The COD level was measured under the condition of a pulse measurement of the width 50 ns and duty 50%, and at the room temperature.

TABLE 2

|  | example 1 | example 2 | comparison example 1 |
| --- | --- | --- | --- |
| plasma atmosphere | only nitrogen gas | mixture of nitrogen gas and argon gas | only argon gas |
| initial value [mW] | 700 | 600 | 200 |
| after 200 hours [mW] | 600 | 500 | 120 |

From this result, it is understood that a higher COD level is obtained in the example 1 and the example 2 than in the comparison example 1 both in the initial state and after the aging. This reason is considered to be that since nitrogen is contained in the gas for generating the plasma atmosphere to which the samples of the examples 1 and 2 were exposed, removal of nitrogen from the resonator end faces 13 and 14 can be reduced. In addition, comparing the example 1 with the example 2, a higher COD level is obtained in the example 1 than in the example 2 both in the initial state and after the aging. This reason is considered to be that since argon is also contained in the plasma and causes damage to the resonator end faces 13 and 14 in the example 2. In the example 1, the plasma atmosphere contains only nitrogen without argon, so it does not cause damage to the resonator end faces 13 and 14.

Therefore, removal of nitrogen can be reduced, so that the high COD level is obtained compared with the comparison example 1 and the example 2.

In addition, since the high COD level is maintained after the aging, it is suggested that the natural oxide film, the moisture, the contaminant and the like can be removed from the resonator end faces 13 and 14 by exposing to the plasma atmosphere generated from the gas containing nitrogen gas in the same manner as the exposure to the plasma atmosphere generated from the only argon gas.

In accordance with the above-described result, quantity of nitrogen in the resonator end faces 13 and 14 that were exposed to the plasma atmosphere under the three conditions described above is measured by the AES measurement in order to confirm that the exposure to the plasma atmosphere generated from the gas containing nitrogen gas reduces removal of nitrogen from the resonator end faces 13 and 14. The result is shown in Table 3. Here, the quantity of nitrogen means a value when quantity of nitrogen per unit area in the resonator end faces 13 and 14 just after the cleavage is 100%.

TABLE 3

|  | example 1 | example 2 | comparison example 1 |
|---|---|---|---|
| plasma atmosphere | only nitrogen gas | mixture of nitrogen gas and argon gas | only argon gas |
| quantity of nitrogen in resonator end face | 96% | 90% | 77% |

The quantity of nitrogen is the minimum value in the comparison example 1 and the maximum value in the example 1. Therefore, it is confirmed that there is a correlation between the quantity of nitrogen in the resonator end faces 13 and 14 of the nitride semiconductor laser element and the COD level in which the more the former is, the higher the latter is. Furthermore, it was found from the inventor's study that nitrogen gas in a plasma state easily adhere to the resonator end faces 13 and 14, but nitrogen gas in a molecular state does not adhere to the resonator end faces 13 and 14 only by exposing to the same, so it cannot prevent the drop of the COD level.

Next, the COD levels of another nitride semiconductor laser device 40 are measured in the initial state and after the aging of 200 hours. The nitride semiconductor laser device 40 was manufactured by using another nitride semiconductor laser element 49 whose resonator end face had been exposed to the plasma atmosphere generated under the condition shown in Table 4. In the example 3, the plasma atmosphere was generated from the only nitrogen gas. In the comparison example 2, the plasma atmosphere was generated from the only argon gas.

TABLE 4

|  | example 3 | comparison example 2 |
|---|---|---|
| plasma atmosphere | only nitrogen gas | only argon gas |
| argon flow rate [sccm] | 0 | 40 |
| nitrogen flow rate [ccm] | 20 | 0 |
| microwave power [W] | 500 | 500 |
| furnace back pressure [Pa] | $0.5 \times 10^{-2}$ | $1.4 \times 10^{-1}$ |
| process time [min] | 5 | 5 |
| process temperature | room temperature | room temperature |

Figure 6:
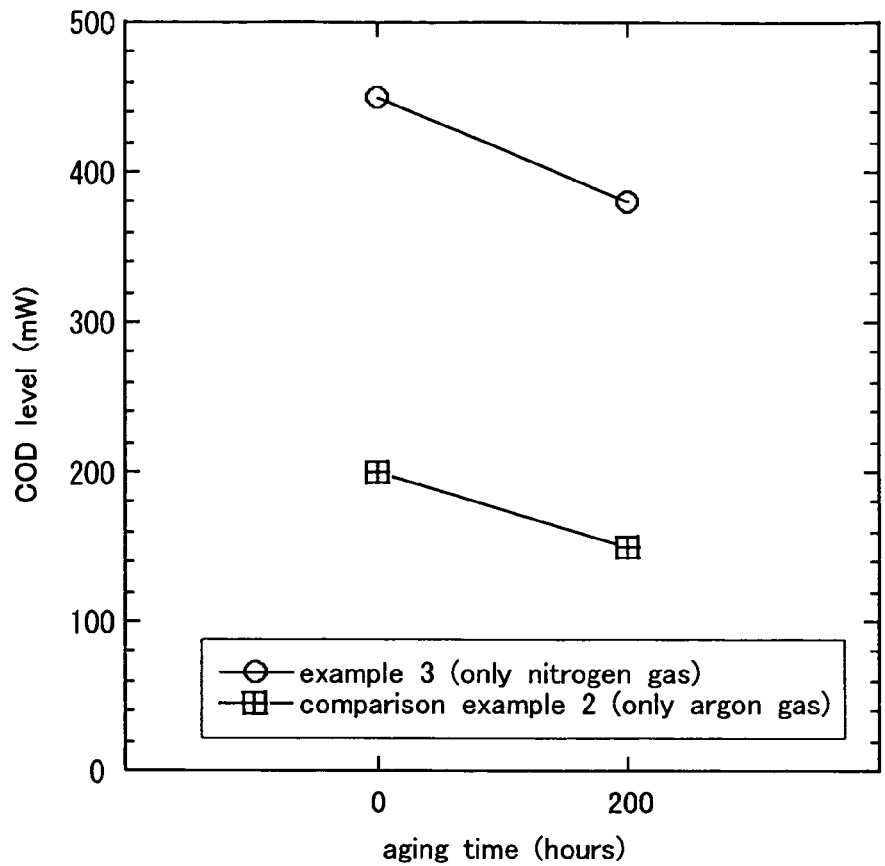
FIG. 6 is a graph showing the COD levels of another nitride semiconductor laser element according to the first embodiment, before and after an aging.

The aging condition was the ambient temperature 70° C., the power 60 mW and the APC drive. The COD measurement condition is 50 ns, the duty 50%, the room temperature and the pulse measurement. The result is shown in FIG. 6 and Table 5. FIG. 6 is a graph plotted in a plane in which the horizontal axis corresponds to the aging time and the vertical axis corresponds to the COD level.

TABLE 5

|  | example 3 | comparison example 2 |
|---|---|---|
| plasma atmosphere | only nitrogen gas | only argon gas |
| initial value [mW] | 600 | 200 |
| after 200 hours [mW] | 500 | 150 |

From this result, it is understood that the COD level is higher by nearly three times in the case where plasma atmosphere for the exposure is generated from nitrogen gas than in the case where plasma atmosphere is generated from argon gas.

Figure 7:
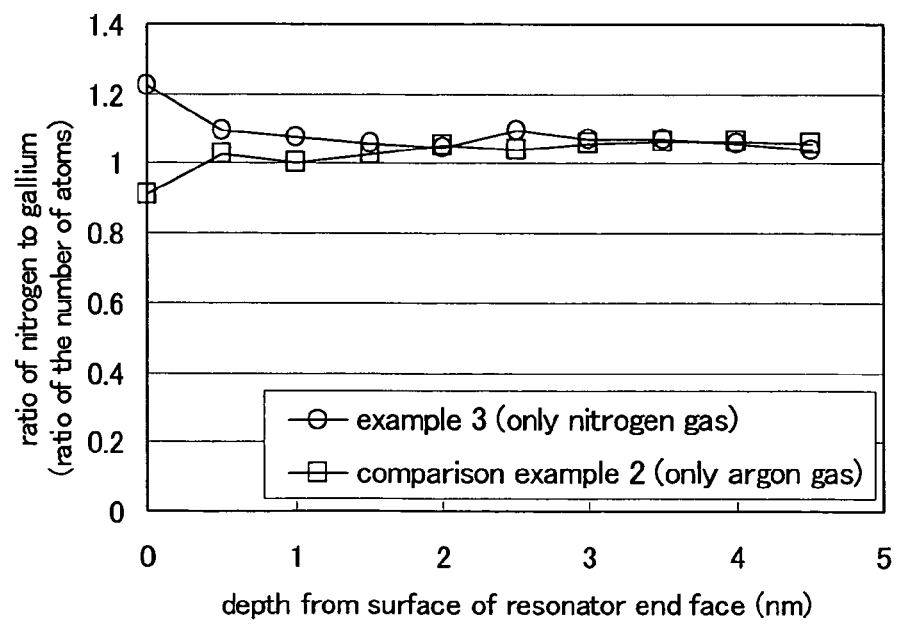
FIG. 7 is a graph showing a relationship between a ratio of nitrogen to gallium and a depth from the surface of the resonator end face to the inside of the nitride semiconductor laser element according to the first embodiment.

These two nitride semiconductor laser elements 49 were etched from the resonator end face toward the inside while the AES (Auger Electron Spectroscopy) measurement was performed so that quantity of nitrogen was measured. The result is shown in FIG. 7. FIG. 7 is a graph plotted in a plane in which the horizontal axis (X-axis) corresponds to a depth from the surface of the resonator end face and the vertical axis (Y-axis) corresponds to the ratio of nitrogen to gallium (ratio of the number of atoms). In FIG. 7, the part of X=0 is the interface between the resonator end face 13 made of GaN and the low reflection coating film 34. For example, the part of X=2 nm means 2 nm inside from this interface, and the ratio of nitrogen to gallium here is indicated.

Next, a method for calculating the relative quantity of nitrogen in the surface of the resonator end face of the nitride semiconductor laser element in this specification will be described.

1) Perform the AES measurement on the resonator end face of the nitride semiconductor laser element that was not exposed.

1-1) Determine the ratio (a) of nitrogen to gallium in the surface of the resonator end face.

1-2) Calculate an average (b) of the ratios of nitrogen to gallium in the range of the depth 2-4.5 nm from the surface of the resonator end face.

1-3) Calculate a value (c=a/b) that is obtained by dividing the value (a) obtained in 1-1 by the value (b) obtained in 1-2.

2) Perform the AES measurement on the resonator end face of the nitride semiconductor laser element that was exposed.

2-1) Determine the ratio (d) of nitrogen to gallium in the resonator end face.

2-2) Calculate an average (e) of the ratios of nitrogen to gallium in the range of the depth 2-4.5 nm from the surface of the resonator end face.

2-3) Calculate a value (f=d/e) that is obtained by dividing the value (d) obtained in 2-1 by the value (e) obtained in 2-2.

3) Calculate a value (g=f/c) that is obtained by dividing the value (f) obtained in 2-3 by the value (c) obtained in 1-3. The value (g) obtained in this way is defined as the relative quantity of nitrogen in the resonator end face in this specification.

As understood from this definition, the relative quantity of nitrogen in the surface of the resonator end face is based on the ratio of nitrogen to gallium in the face that is not exposed to the plasma atmosphere. Therefore, if the exposure of the nitride semiconductor laser element is already finished and one that is not exposed is not available, the nitride semiconductor laser element that was exposed may be cleaved by scribing to form a new end surface, in which the ratio of nitrogen to gallium may be measured to be a reference. In this way, the result of measurement in this face to be the reference is compared with the result of measurement in the face that was exposed. Thus, even if there is no sample that was not exposed, the relative quantity of nitrogen in the resonator end face can be measured.

Figure 13:
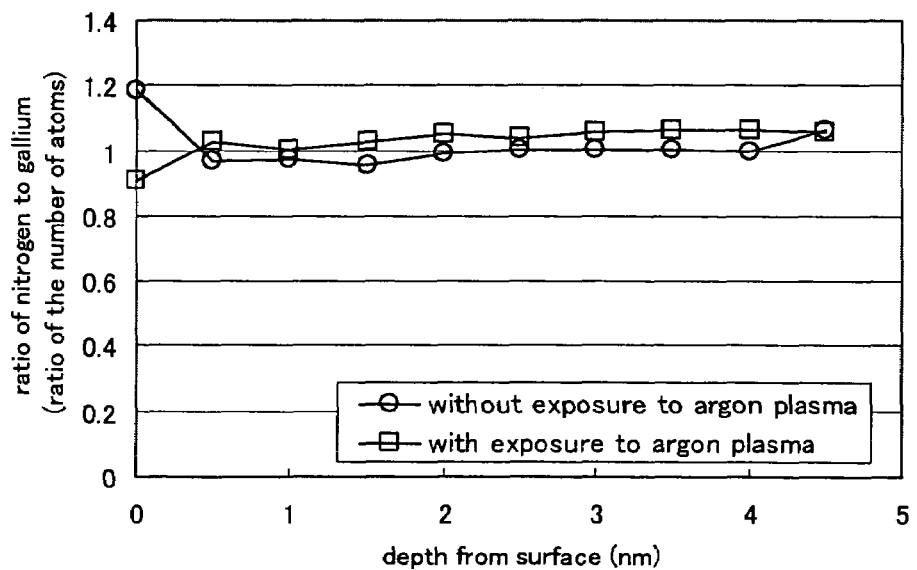
FIG. 13 is a graph showing a relationship between the ratio of nitrogen to gallium and a depth from the surface of the resonator end face to the inside of the conventional nitride semiconductor laser element.

Based on the calculation method described above, the relative quantity of nitrogen in the surface of the resonator end face is determined for the sample shown in FIG. 7. First, the result of the sample that was not exposed to the argon plasma atmosphere shown in FIG. 13 is used as a reference. In the sample that was not exposed to the argon plasma atmosphere shown in FIG. 13, the ratio (a) of nitrogen to gallium in the surface (X=0 in FIG. 13) of the resonator end face is 1.185, and the average (b) of ratios of nitrogen to gallium in the range of the depth 2-4.5 nm from the surface is 1.011. Therefore, c=a/b=1.185/1.011≈1.172.

Similar calculation is performed for the sample of the comparison example 2 shown in FIG. 7. The ratio (d) of nitrogen to gallium in the surface of the resonator end face is 0.908, and the average (e) of ratios of nitrogen to gallium in the range of the depth 2-4.5 nm from the surface is 1.055. Therefore, f=d/e=0.908/1.055≈0.861. Accordingly, the relative quantity (g) of nitrogen in the resonator end face of the sample in the comparison example 2 is as follows; g=f/c=0.861/1.172≈0.73=73%.

In addition, concerning the sample of the example 3, the ratio (d) of nitrogen to gallium in the surface of the resonator end face is 1.222, and the average (e) of the ratios of nitrogen to gallium in the range of the depth 2-4.5 nm from the surface is 1.062. Therefore, f=d/e=1.222/1.062≈1.150. Accordingly, the relative quantity (g) of nitrogen in the resonator end face of the example 3 is as follows; g=f/c=1.150/1.172≈0.98=98%.

In this way, the relative quantity of nitrogen in the resonator end face is decreased in the sample that was exposed to the plasma atmosphere generated from the only argon gas in the comparison example 2 to 73% compared with before the exposure. On the other hand, it is 98% in the sample exposed to the plasma atmosphere generated from the only nitrogen gas in the example 3, which is nearly the same value as before the exposure. Therefore, if the plasma atmosphere for the exposure is generated from the only nitrogen gas, the natural oxide or the like can be removed without reducing nitrogen in the resonator end face of the nitride semiconductor laser element. In addition, after the exposure to the plasma atmosphere, a high initial COD level and a reduction of a rate of decreasing COD due to the aging can be realized by maintaining a high relative quantity of nitrogen in the resonator end face.

Figure 8:
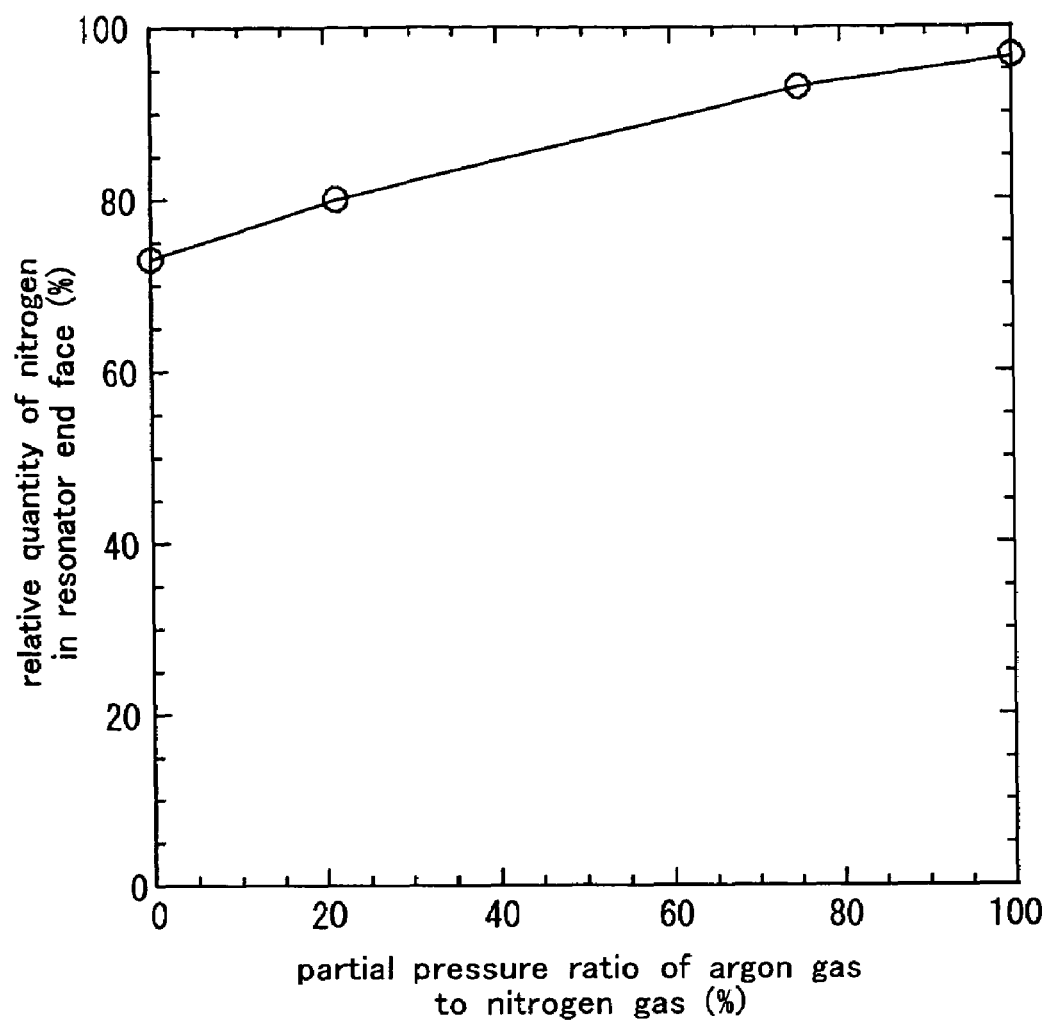
FIG. 8 is a graph showing a relationship between a partial pressure ratio of nitrogen gas to argon gas and a relative quantity of nitrogen in the resonator end face.

Next, samples of the nitride semiconductor laser element were manufactured while the partial pressure ratio of nitrogen gas to argon gas contained in the gas for generating the plasma atmosphere for the exposure is altered in the range of 0-100%. Then the relative quantity of nitrogen in the resonator end face of each sample was calculated based on the AES measurement. The result is shown in FIG. 8. FIG. 8 is a graph plotted in a plane in which the horizontal axis corresponds to the partial pressure ratio of nitrogen gas to argon gas and the vertical axis corresponds to the relative quantity of nitrogen in the resonator end face. It is understood from FIG. 8 that there is a correlation between the partial pressure ratio of the nitrogen gas to the argon gas in the gas for generating the plasma atmosphere for the exposure and the relative quantity of nitrogen in the resonator end face. If the former increases, the latter also increases. Therefore, the relative quantity of nitrogen in the resonator end face can be controlled by controlling the partial pressure ratio of nitrogen gas to argon gas contained in the gas.

Figure 9:
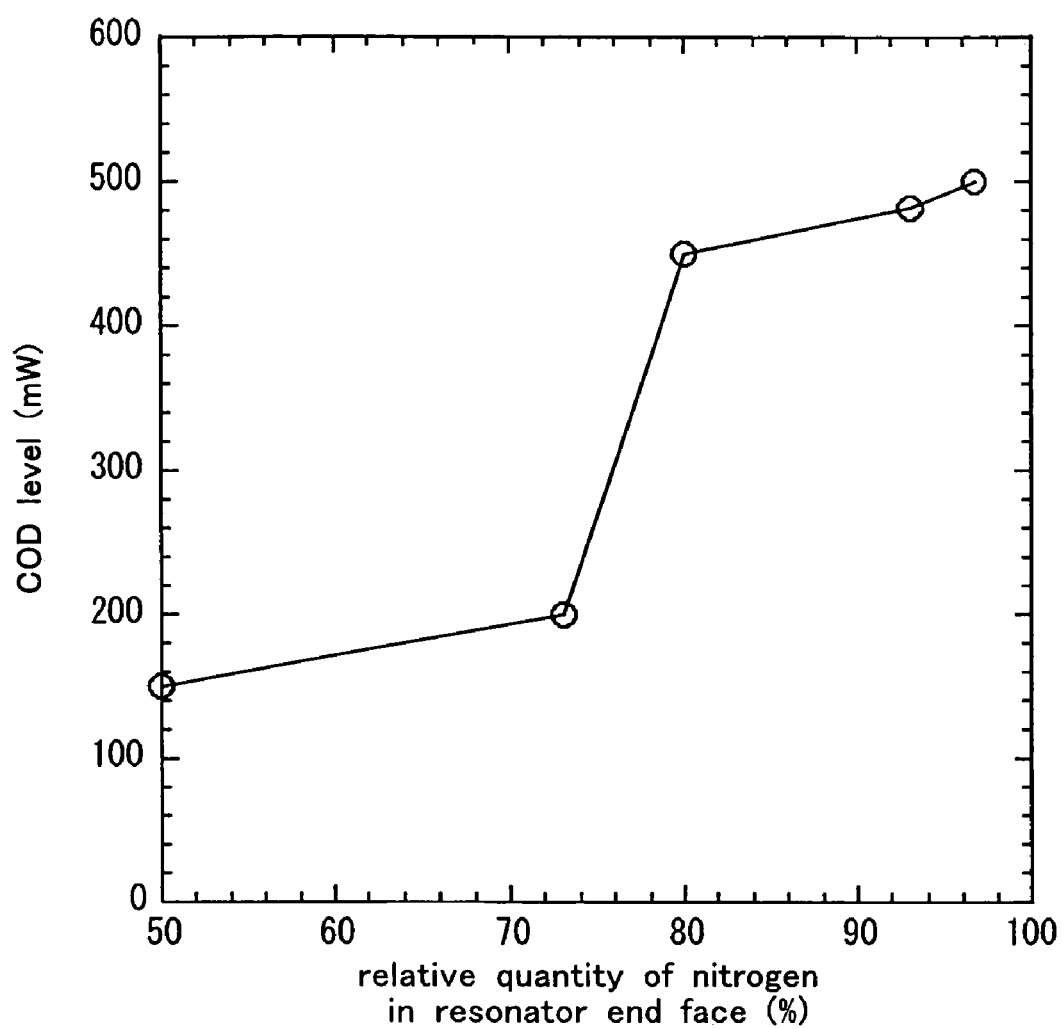
FIG. 9 is a graph showing a relationship between the relative quantity of nitrogen and the COD level in the resonator end face after the aging.

Similarly, samples of the nitride semiconductor laser element having different relative quantities of nitrogen in the resonator end face were manufactured while the partial pressure ratio of nitrogen gas to argon gas contained in the gas for generating the plasma atmosphere for the exposure is altered in the range of 0-100%. Then, the aging test is performed for the samples under the condition of the ambient temperature 70° C., the power 60mW and the APC drive for 200 hours. The result is shown in FIG. 9. In FIG. 9, the horizontal axis corresponds to the relative quantity of nitrogen in the resonator end face, while the vertical axis corresponds to the COD levels after the aging. It is understood from FIG. 9 that there is a correlation between the relative quantity of nitrogen in the resonator end face and the COD level after the aging; if the former increases, the latter also increases. Therefore, in order to realize a high COD level and a low ratio of deterioration, it is necessary to maintain the high relative quantity of nitrogen in the resonator end face after the exposure. In addition, it is understood that if the relative quantity of nitrogen in the resonator end face becomes less than 80%, the COD level after the aging decreases substantially. For this reason, it is desirable that the relative quantity of nitrogen in the resonator end face is 80% or more.

Figure 10:
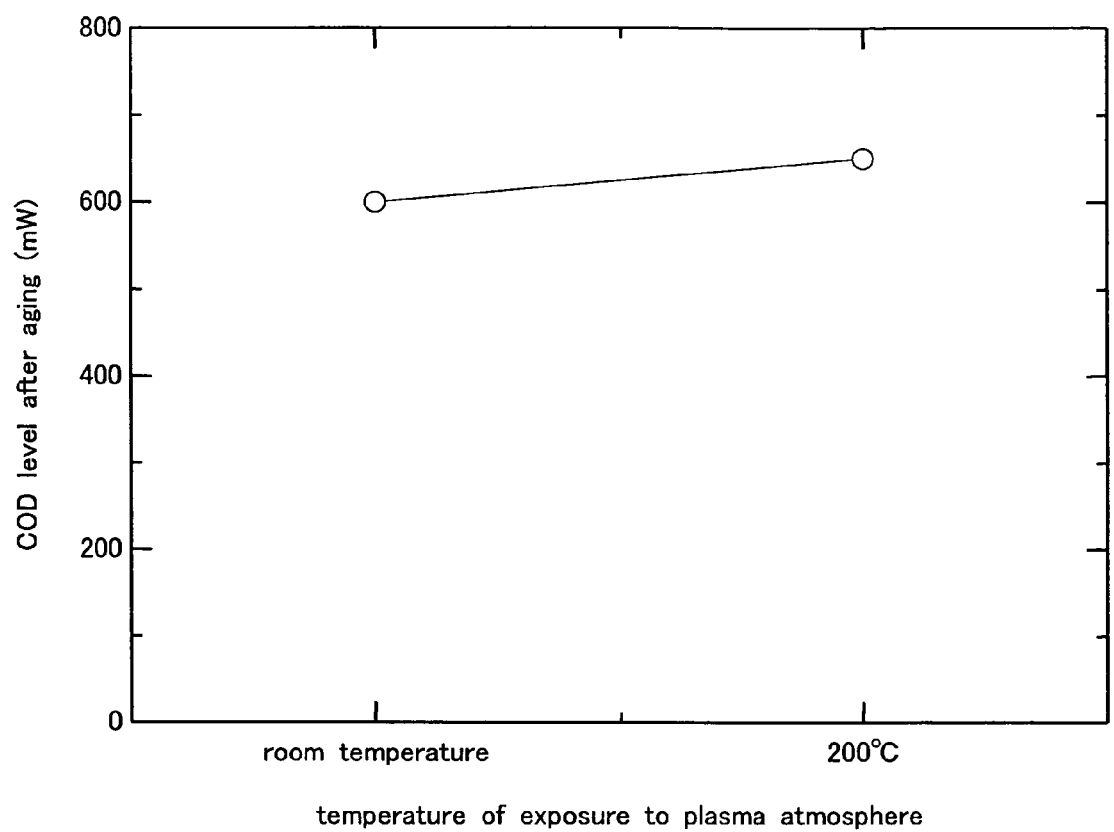
FIG. 10 is a graph showing a relationship between a temperature of the nitride semiconductor laser bar when it is exposed to a plasma atmosphere and the COD level after the aging.
Figure 11:
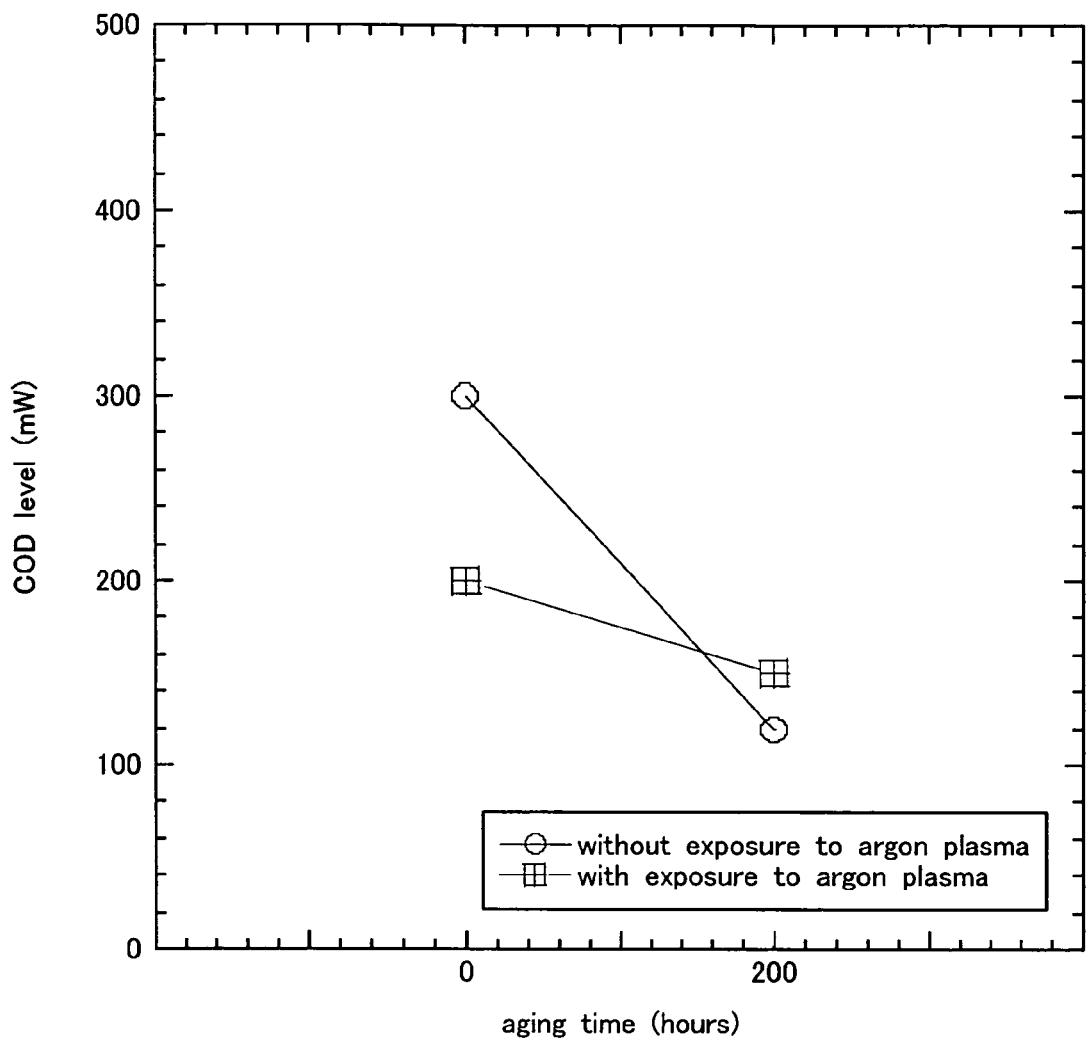
FIG. 11 is a graph showing the COD levels of a conventional nitride semiconductor laser element before and after the aging.
Figure 12:
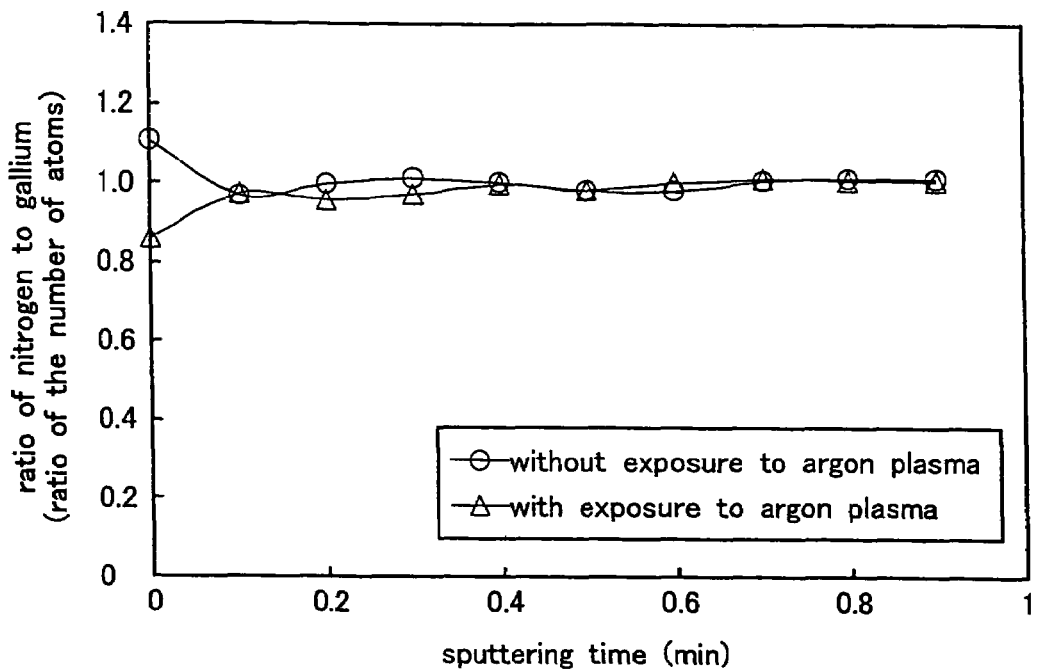
FIG. 12 is a graph showing a relationship between a ratio of nitrogen to gallium in a sputtering face and a sputtering time of the conventional nitride semiconductor laser element.

In the embodiment of the present invention, when the resonator end face is exposed to the plasma atmosphere generated from the gas containing nitrogen gas, the nitride semiconductor laser bar 10 may be either at the room temperature or heated. If it is heated, deposition efficiency of nitrogen to the resonator end face can be improved. In addition, an efficiency of removal of the natural oxide film or the like can be improved, too. In the ECR sputtering device 50, the nitride semiconductor laser bar 10 was heated by the heater 63 to 200° C. and exposed to the plasma atmosphere generated from the only nitrogen gas. Concerning the nitride semiconductor laser device 40 using the nitride semiconductor laser element 49 made from this nitride semiconductor laser bar 10, the COD levels were measured before and after the aging of 200 hours. The result is shown in FIG. 10. In FIG. 10, the horizontal axis corresponds to the temperature of exposure to plasma atmosphere, and the vertical axis corresponds to the COD level. FIG. 10 also shows a measurement result of COD levels after the aging of the nitride semiconductor laser device that was exposed to the plasma atmosphere containing only nitrogen gas at the room temperature under the same condition. The aging condition is as follows. The ambient temperature is 70° C., and the power is 60 mW in the APC drive. The measurement condition of the COD level is the pulse measurement of the width 50 ns and the duty 50% at the room temperature. It is understood from FIG. 10 that when the exposure to the plasma atmosphere containing the only nitrogen gas is performed in the heated state, the COD level is further improved.

Next, a relationship between the temperature of the nitride semiconductor laser bar 10 when it is exposed to the plasma atmosphere and the quantity of nitrogen in the resonator end faces 13 and 14 is measured by the AES measurement method. The result is shown in Table 6. This quantity of nitrogen is a value when the quantity of nitrogen per unit area in the resonator end faces 13 and 14 just after the cleavage is 100%.

TABLE 6

| element temperature | room temperature | 200° C. |
|---|---|---|
| plasma atmosphere | only nitrogen gas | only nitrogen gas |
| quantity of nitrogen in resonator end face | 96% | 99% |

It is understood from Table 6 that when the exposure to the plasma atmosphere containing the only nitrogen gas is performed in the state where the nitride semiconductor laser bar 10 is heated, the removal of nitrogen from the resonator end faces 13 and 14 can be reduced more effectively. This heating temperature is preferably within the range of 100-500° C., and more preferably within the range of 150-500° C. Further, the range of 200-400° C. is much more preferable. It is because if the temperature is higher than 500° C., an electrode portion or the like may be broken down, so that the voltage may be raised when the nitride semiconductor laser element 49 is supplied with electricity.

In addition, in the embodiment of the present invention, it is possible to perform the exposure of the resonator end face to the plasma atmosphere generated from the gas containing nitrogen gas in a special chamber for exposure. As the ECR sputtering device, a device may be used that is provided with the special chamber for exposure (not shown) disposed between the plasma production chamber 70 and the film forming furnace 60 shown in FIG. 3. In this ECR sputtering device, the special room for exposure is connected to the film forming furnace under high vacuum state, so that the nitride semiconductor laser bar 10 can be transported between the special room for exposure and the film forming furnace without exposing it to external atmosphere under the high vacuum state. The special room for exposure has no target but is equipped with an RF plasma source as a plasma source. In addition, the film forming furnace is provided with a target that is connected to the RF power supply. Since the ECR sputtering device is structured in this way, it is unnecessary to perform oxidization of the inside of the film forming furnace.

In the ECR sputtering device having the structure described above, the resonator end faces 13 and 14 of the nitride semiconductor laser bar 10 was exposed to the plasma atmosphere containing the only nitrogen gas in the special room for exposure, and then the nitride semiconductor laser bar 10 was transported to the film forming furnace under the high vacuum state. In the film forming furnace, a film of $Ta_2O_5$ having the thickness of 50 nm was formed on the resonator end faces 13 and 14. The nitride semiconductor laser element 49 obtained from this nitride semiconductor laser bar 10 was used for manufacturing the nitride semiconductor laser device 40, and the same test as described above was performed. Consequently, a similar result was obtained concerning the quantity of nitrogen and the COD level of the resonator end face, in which superior characteristics was obtained than the case where it was exposed to the plasma atmosphere containing the only argon gas.

In this embodiment, the power of microwave that is used for generating plasma is preferably within the range of 200-800 watts. If the power is lower than 200 watts, nitrogen cannot adhere to the resonator end faces 13 and 14, and the natural oxide film, the moisture, the contaminant and the like cannot be removed sufficiently. If the power is higher than 800 watts, nitrogen may be removed from the resonator end faces 13 and 14 even in the plasma generated from the only nitrogen gas. This reason is considered to be that nitrogen ions contained in the plasma cause damage to the resonator end faces 13 and 14.

In addition, a time period of the exposure to the plasma atmosphere is preferably within the range of 30 seconds to 20 minutes. If the time period is shorter than 30 seconds, the natural oxide film, the moisture, the contaminant and the like cannot be removed sufficiently from the resonator end faces 13 and 14. If the time period is longer than 20 minutes, nitrogen may be removed from the resonator end faces 13 and 14 even if the power of microwave used for generating the plasma is within the range of 200-800 watts resulting in an undesired result.

In addition, if a mixture gas containing nitrogen gas is used as the gas for generating the plasma atmosphere to which the resonator end face is exposed, it is possible to use an inert gas except for argon (such as helium, neon, krypton or xenon) or to use a mixture gas of two or more kinds of inert gases. Note that the inert gas means helium, neon, argon, krypton and xenon in this specification.

Second Embodiment

Next, a second embodiment of the present invention will be described. The second embodiment is similar to the first embodiment except that the exposure of the resonator end face to the plasma atmosphere is performed in two stages.

In this embodiment, the exposure of the resonator end face to the plasma atmosphere is performed in two stages. The resonator end face is exposed to the plasma atmosphere generated from the only argon gas in the first stage, and to the plasma atmosphere generated from the only nitrogen gas in the second stage. An example of the conditions in this case is shown in Table 7.

TABLE 7

| | first stage | second stage |
|---|---|---|
| plasma atmosphere | only argon gas | only nitrogen gas |
| argon flow rate [sccm] | 40 | 0 |
| nitrogen flow rate [sccm] | 0 | 40 |
| microwave power [W] | 300 | 700 |
| furnace back pressure [Pa] | $1.4 \times 10^{-1}$ | $1 \times 10^{-1}$ |
| process time [min] | 1 | 10 |
| process temperature | room temperature | room temperature |

According to this embodiment, the natural oxide film and the like are removed from the resonator end faces 13 and 14 of the nitride semiconductor laser bar 10 in the first stage, and nitrogen is also removed. In the second stage, nitrogen is absorbed again by the resonator end faces 13 and 14 from which nitrogen was removed once. Therefore, the nitrogen gas can be utilized mainly for maintaining quantity of nitrogen in the resonator end faces 13 and 14 without using it for removing the natural oxide film and the like. The relative quantity of nitrogen in the surface of the resonator end faces 13 and 14 that was exposed to the plasma atmosphere under the condition shown in Table 7 is 98%, which is nearly the same value as before the exposure.

In addition, another example of the exposure condition under which the resonator end face is exposed to the plasma atmosphere in this embodiment is shown in Table 8. Here, temperature of the nitride semiconductor laser bar when it is exposed to the plasma atmosphere is set to 300° C.

TABLE 8

| | first stage | second stage |
|---|---|---|
| plasma atmosphere | only argon gas | only nitrogen gas |
| argon flow rate [sccm] | 20 | 0 |
| nitrogen flow rate [sccm] | 0 | 40 |
| microwave power [W] | 300 | 700 |
| furnace back pressure [Pa] | $1.1 \times 10^{-1}$ | $7.3 \times 10^{-2}$ |
| process time [min] | 10 | 10 |
| process temperature [° C.] | 300 | 300 |

As to the nitride semiconductor laser bar 10 exposed to the plasma atmosphere under the condition shown in Table 8, quantity of nitrogen in the resonator end faces 13 and 14 was measured, and the result was 98%, which was nearly the same as before the exposure. This quantity of nitrogen is a value when the quantity of nitrogen per unit area of the resonator end faces 13 and 14 just after the cleavage is 100%.

In each of the two conditions mentioned above, a result similar to that of the first embodiment was obtained concerning the quantity of nitrogen and the COD level in the resonator end face of the nitride semiconductor laser element.

Further in this embodiment, the power of microwave in the first stage is preferably within the range of 200-800 watts. If this power is lower than 200 watts, the natural oxide film, the moisture, the contaminant and the like cannot be removed sufficiently from the resonator end faces 13 and 14. If the power is higher than 800 watts, nitrogen is removed from the resonator end faces 13 and 14 substantially so that the quantity of nitrogen cannot be recovered even if it is exposed to the plasma atmosphere containing the only nitrogen gas in the second stage.

Time period of the exposure to the plasma atmosphere in the first stage is preferably within the range of 30 seconds to 20 minutes. If the time period is shorter than 30 seconds, the natural oxide film, the moisture, the contaminant and the like cannot be removed sufficiently from the resonator end faces 13 and 14. If the time period is longer than 20 minutes, nitrogen may be removed from the resonator end faces 13 and 14 sufficiently so that the quantity of nitrogen cannot be recovered even if it is exposed to the plasma atmosphere containing the only nitrogen gas in the second stage.

When the nitride semiconductor laser bar 10 is exposed to the plasma atmosphere in the first stage, the nitride semiconductor laser bar 10 may be either at the room temperature or heated. However, if a temperature of the nitride semiconductor laser bar 10 becomes 500° C. or higher, an electrode portion or the like may be broken down, so that the voltage may be raised when the nitride semiconductor laser element 49 is supplied with electricity resulting in an undesired result.

The power of microwave in the second stage is preferably within the range of 200-800 watts. If the power is lower than 200 watts, it is difficult to compensate nitrogen to the extent that is capable of recovering the quantity of nitrogen in the resonator end faces 13 and 14 that was reduced in the first stage. On the other hand, if the power is higher than 800 watts, nitrogen is removed from the resonator end faces 13 and 14 even in the plasma atmosphere generated from the only nitrogen gas. This reason is considered to be probably the damage caused by nitrogen ions in the plasma atmosphere.

In addition, a time period of the exposure to the plasma in the second stage is preferably within the range of 30 seconds to 20 minutes. If the time period is shorter than 30 seconds, it is difficult to compensate nitrogen to the extent that is capable of recovering the quantity of nitrogen in the resonator end faces 13 and 14 that was reduced in the first stage. If the time period is longer than 20 minutes, nitrogen is removed from the resonator end faces 13 and 14 even in the plasma atmosphere generated from the only nitrogen gas.

In addition, when the nitride semiconductor laser bar is exposed to the plasma atmosphere in the second stage, the nitride semiconductor laser bar may be either at the room temperature or heated. Even if the nitride semiconductor laser bar is not heated, the effect of the present invention about reducing removal of nitrogen from the resonator end faces 13 and 14 can be obtained. If the nitride semiconductor laser bar is heated, the heating temperature is preferably within the range of 100-500° C., and more preferably within the range of 200-400° C. If the heating temperature is higher than 500° C., an electrode portion or the like may be broken down, so that the voltage may be raised when the nitride semiconductor laser element 49 is supplied with electricity.

In this embodiment, when the resonator end face is exposed to the plasma atmosphere in the first stage, other than the only argon gas, an inert gas except for argon may be used as the gas for generating the plasma atmosphere. Alternatively, a mixture gas of the inert gas and the nitrogen gas may be used.

Further this embodiment, the exposure of the resonator end face to the plasma atmosphere can be performed in three or more stages without limiting to the two stages as long as the plasma atmosphere for the exposed in the final stage is generated from the gas containing nitrogen gas. In each stage, other than the gas described above, a mixture gas of an inert gas and nitrogen gas can be used for the plasma atmosphere. In addition, the inert gas may contain two or more kinds of inert gases.

Note that in the first and the second embodiments the exposure of the resonator end face before the formation of the coating film to the plasma generated from the gas containing nitrogen gas should be performed at least for the resonator end face 13 on the light exit side so as to obtain the effect. This is because that light density is lower in the resonator end face 14 on the light reflection side than in the resonator end face 13 on the light exit side, so that heat generation is less in the resonator end face 14 on the light reflection side resulting in little possibility of the COD breakdown. However, since there is a possibility of the COD breakdown in the resonator end face 14 on the light reflection side. Therefore, it is preferable to expose the resonator end face 14 on the light reflection side too.

In addition, it is important to form the coating film on the resonator end face without exposing to air after exposing to the plasma atmosphere generated from the gas containing nitrogen gas in the present invention. Therefore, if the coating film is formed to cover the entire resonator end face after the exposure to the plasma atmosphere generated from the gas containing nitrogen gas without exposing to air, it is no problem to expose the nitride semiconductor laser element after that. Accordingly, it is possible to form another coating film additionally. Thus, it is possible to form a multilayered coating films made of plural materials, so that flexibility of designing the nitride semiconductor laser element can be enhanced. Therefore, the formation of the reflection layer 36 of the high reflection coating film 37 may be performed in another device with exposing to air after forming the protection layer 35.

In addition, as materials of the low reflection coating film 34 and the high reflection coating film 37, it is possible to use an oxide of Al, Ti, Si, Y, Nb, Ta, Zr, Hf or Zn, or a nitride of Al or Si, or an oxide nitride of Al or Si, or a fluoride of Mg or Ca.

Further in the first or the second embodiment, an EB (Electron Beam) evaporator may be used instead of the ECR sputtering device for forming the coating film. If the EB evaporator is equipped with a plasma generation device, there is no problem without performing oxidization of the inside of the furnace. In the case of the EB evaporator, generation plot of the plasma gas and the target can be separated from each other. Therefore, there is no possibility that the plasma gas causes the target to be sputtered and the material adheres to the sample.

In addition, it is possible to use an RF (Radio Frequency) sputtering device instead of the ECR sputtering device. If the RF plasma method was used for making the nitrogen gas to be in a plasma state, nitrogen in an atomic state is generated a lot, and the nitrogen adhere a resonator end face easily. Therefore, the removal of nitrogen can be prevented effectively. The RF plasma method uses a high frequency at 13.56 MHz for making the gas to be in a plasma state and does not use a cyclotron movement by a magnetic field unlike the ECR plasma method. Other than that, the method of forming the coating film is similar to that of the ECR plasma method.

In addition, the resonator end faces 13 and 14 are not limited to be ones formed by cleavage but may be etched mirrors that are ones formed by vapor phase etching such as an RIE (Reactive Ion Etching) method or an ICP (Inductive Coupled Plasma) method, or wet etching with a solution of KOH (potassium hydrate) or the like. The present invention can be applied to the etched mirror too without any problem, since removal of nitrogen is observed when the etching is performed.

What is claimed is:

1. A method for manufacturing a nitride semiconductor laser element, the method comprising:
   a nitride semiconductor layer formation step for forming a nitride semiconductor layer on a substrate; and
   a cleavage step for cleaving the substrate on which the nitride semiconductor layer is formed, so as to form two resonator end faces that are parallel to each other, wherein
   the method further comprises a first exposure step for exposing the resonator end faces to a first plasma atmosphere generated from nitrogen gas or a mixture gas of an inert gas and nitrogen gas, and in the first exposure step, when a ratio of nitrogen to gallium in a surface of the resonator end faces before the exposure to the first plasma atmosphere is represented by "a", an average value of ratios of nitrogen to gallium inside from the surface of the resonator end faces before the exposure is represented by "b", a ratio of nitrogen to gallium in the surface of the resonator end faces after the exposure to the first plasma atmosphere is represented by "d", and an average value of ratios of nitrogen to gallium inside from the surface of the resonator end faces after the exposure is represented by "e", the value "g" that is expressed by $g=(b \cdot d)/(a \cdot e)$ is set to a value that satisfies $g \geq 0.8$.

2. The method according to claim 1, wherein the method further comprises a second exposure step for exposing the resonator end faces to a second plasma atmosphere generated from an inert gas, between the cleavage step and the first exposure step.

3. The method according to claim 1, wherein the method further comprises forming an end face coating film for protecting the resonator end faces from an optical damage, after the first exposure step.

4. The method according to claim 3, wherein the end face coating film is made of an oxide of Al, Ti, Si, Y, Nb, Ta or Zr.

5. The method according to claim 3, wherein the end face coating film is made of a nitride of Al or Si.

6. The method according to claim 3, wherein the two resonator end faces have end face coating films made of the same material.

7. The method according to claim 3, wherein the end face coating film is formed by an electron cyclotron resonance sputtering method or a high frequency sputtering method.

8. The method according to claim 1, wherein a temperature of the substrate in the first exposure step is within the range of 150-500° C.

9. The method according to claim 1, wherein a temperature of the substrate in the first exposure step is within the range of 200-400° C.

10. The method according to claim 2, wherein a temperature of the substrate in the second exposure step is within the range of 150-500° C.

11. The method according to claim 2, wherein a temperature of the substrate in the second exposure step is within the range of 200-400° C.

12. A nitride semiconductor laser element manufactured by the method according to claim 1.

13. A method for manufacturing a nitride semiconductor laser element, the method comprising:
   a nitride semiconductor layer formation step for forming a nitride semiconductor layer on a substrate;
   a cleavage step for cleaving the substrate on which the nitride semiconductor layer is formed, so as to form two resonator end faces that are parallel to each other; and
   a coating film formation step for forming coating films on the resonator end faces, wherein
   the method further comprises a first exposure step for exposing the resonator end faces to a first plasma atmosphere generated from a gas containing nitrogen gas, between the cleavage step and the coating film formation step, the first exposure step resulting in a relative quantity of nitrogen of 80% or more in each resonator end face.

14. The method according to claim 13, wherein the resonator end faces are not exposed to air during a period from the first exposure step until the coating film formation step is completed.

15. The method according to claim 13, wherein the first plasma atmosphere is generated from a gas containing only nitrogen.

16. The method according to claim 13, wherein the first plasma atmosphere is generated from a gas containing nitrogen and argon.

17. The method according to claim 13, wherein a film containing the element that constitutes the coating film is not formed on the resonator end faces in the first exposure step.

18. The method according to claim 13, wherein the substrate on which the nitride semiconductor layer is formed is heated to a temperature within the range of 100-500° C. in the first exposure step.

19. The method according to claim 13, wherein a time period for exposing the resonator end faces to the first plasma atmosphere in the first exposure step is within the range of 30 seconds to 20 minutes.

20. The method according to claim 13, wherein the first plasma atmosphere is generated by an electron cyclotron resonance.

21. The method according to claim 20, wherein a power of microwave of the electron cyclotron resonance m the first exposure step is within the range of 200-800 watts.

22. The method according to claim 13, wherein at least one of the coating films is made of an oxide of Al, Ti, Si, Y, Nb, Ta, Zr, Hf or Zn, or a nitride of Al or Si, or an oxide nitride of Al or Si.

23. The method according to claim 13, further comprising a second exposure step for exposing the resonator end faces to a second plasma atmosphere generated from an inert gas or a mixture gas of an inert gas and nitrogen gas, between the cleavage step and the first exposure step.

24. The method according to claim 23, wherein the inert gas is argon in the second exposure step.

25. The method according to claim 23, wherein the substrate on which the nitride semiconductor layer is formed is heated to a temperature within the range of 100-500° C. in the second exposure step.

26. The method according to claim 23, wherein a time period for exposing the resonator end faces to the second plasma atmosphere in the second exposure step is within the range of 30 seconds to 20 minutes.

27. The method according to claim 23, wherein the second plasma atmosphere is generated by an electron cyclotron resonance.

28. The method according to claim 27, wherein a power of microwave of the electron cyclotron resonance in the second exposure step is within the range of 200-800 watts.

* * * * *